United States Patent [19]

Eaton et al.

[11] E Patent Number: Re. 32,682

[45] Reissued Date of Patent: May 31, 1988

[54] FOLDED BIT LINE-SHARED SENSE AMPLIFIERS

[75] Inventors: Sargent S. Eaton; David Wooten, both of Colorado Springs, Colo.

[73] Assignee: INMOS Corporation, Colorado Springs, Colo.

[21] Appl. No.: 764,739

[22] Filed: Aug. 12, 1985

Related U.S. Patent Documents

Reissue of:

[64] Patent No.: 4,351,034
Issued: Sep. 21, 1982
Appl. No.: 195,728
Filed: Oct. 10, 1980

[51] Int. Cl.[4] ..... G11C 13/00

[52] U.S. Cl. ..... 365/189; 365/203

[58] Field of Search ..... 361/101, 189, 230, 205, 361/149

[56] References Cited

U.S. PATENT DOCUMENTS

| | | | |
|---|---|---|---|
| 3,560,940 | 2/1971 | Gaensslen | 365/189 |
| 4,025,907 | 5/1977 | Karp et al. | 365/205 |
| 4,233,675 | 11/1980 | Karp et al. | 365/149 |
| 4,279,023 | 7/1981 | Houghton | 365/203 |

FOREIGN PATENT DOCUMENTS

| | | |
|---|---|---|
| 2647394 | 3/1978 | Fed. Rep. of Germany . |
| 2919166 | 3/1980 | Fed. Rep. of Germany . |
| 148340 | 11/1979 | Japan . |

OTHER PUBLICATIONS

Lee et al., "A 64 kb MOS Dynamic RAM" 1979 *IEEE International Solid State Circuits Conference,* pp. 146–147.

*Primary Examiner*—Terrell W. Fears
*Attorney, Agent, or Firm*—Edward D. Manzo

[57] ABSTRACT

A folded bit line-shared sense amplifier arrangement is described for sensing the logic state of an accessed memory cell in a dynamic MOS random access memory. In the preferred embodiment, a shared sense amplifier is positioned between and coupled to first and second bit lines via first and second isolation transistors. The same shared sense amplifier is also positioned between and coupled to third and fourth bit lines via third and fourth isolation transistors. When the state of an accessed memory cell is to be sensed, its memory cell capacitor is coupled to a selected bit line and a dummy cell capacitor is coupled to the bit line adjacent the selected bit line. A decoding circuit selectively activates the shared sense amplifier to sense a difference in voltage between the selected bit line and its adjacent bit line so as to determine the logic state associated with the accessed memory cell. Then, the sense amplifier latches into this logic state for reading by the input/output buss lines. After the logic state is read, the selecting circuit enables the memory cell capacitor to be refreshed for further sensing by the sense amplifier.

12 Claims, 2 Drawing Sheets

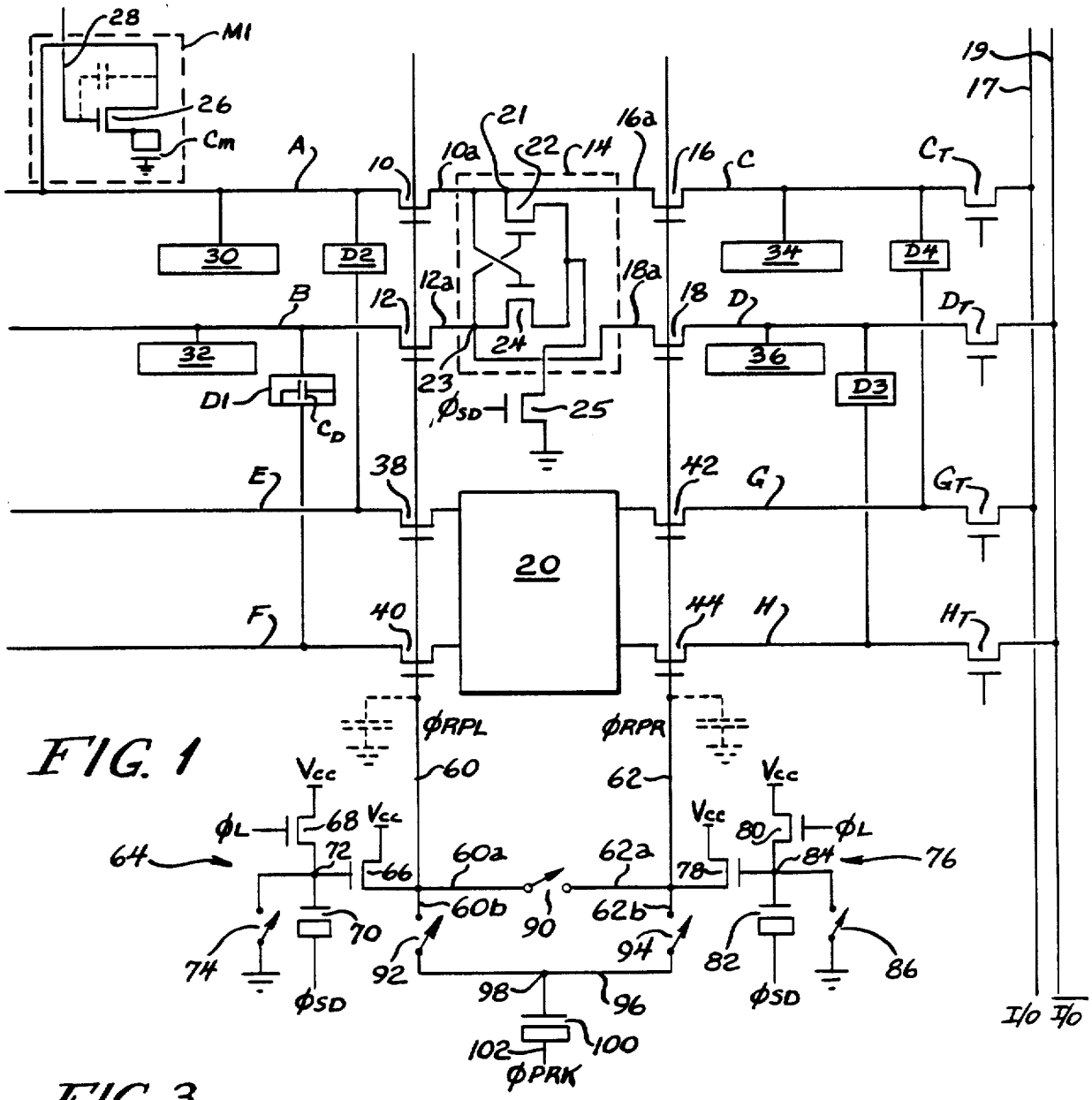
FIG. 3
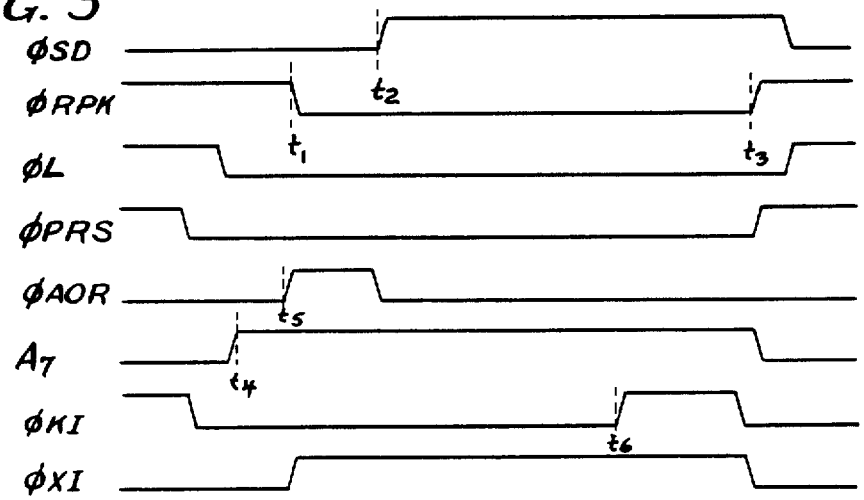

FOLDED BIT LINE-SHARED SENSE AMPLIFIERS

Matter enclosed in heavy brackets [ ] appears in the original patent but forms no part of this reissue specification; matter printed in italics indicates the additions made by reissue.

BACKGROUND OF THE INVENTION

The present invention relates generally to improvements in MOS (metal-oxide-semiconductor) memories and, more particularly, to a shared sense amplifier arrangement for sensing the logic state of a memory cell.

In typical MOS memories, digital data is stored in a matrix of memory cells. Each cell includes a capacitor for storing a charge which indicates whether its cell is in a logic 1 or a logic 0 state. A large number of such memory cells are typically associated with each of the memory's bit lines. A number of dummy cells are also included in the memory. These dummy cells have dummy capacitors which are precharged to reference voltage levels. To sense the state of an addressed memory cell, the charge of the memory's cell capacitor is dumped on a first bit line and the charge on the dummy cell's capacitor is dumped on a second bit line. The resultant difference in voltage on the two bit lines is sensed by a sense amplifier and used as an indication of whether the memory cell is in a logic 1 or a logic 0 state.

In the prior art, a sense amplifier is typically positioned between and coupled to two pairs of bit lines. In addition, the sense amplifier is constructed to sense the voltage difference between diagonally opposite bit lines, i.e., a bit line from one pair on one side of the amplifier and a bit line from the other pair on the other side of the amplifier. One of the sensed bit lines is normally coupled to an accessed memory cell and the other sensed bit line is coupled to a dummy cell so that the sense amplifier can latch in a state representative of the logic level associated with the accessed memory cell. Because the bit lines on one side of the sense amplifier are typically coupled to input/output buss lines, the latter bit lines are used as conductive paths for coupling the latched state of the sense amplifier to the input/output buss lines. This facility for easily reading the latched state of the sense amplifier is a prime reason for the above-mentioned arrangement.

The problem with the above-described arrangement is that a bit line and its diagonally opposite bit line, both of which are being sensed, are not physically near each other. Hence, any noise which affects one of the sensed bit lines does not affect the other sensed bit line in the same manner. The resulting noise differential on the sensed bit lines inhibits the sense amplifier from accurately sensing the voltage level of the accessed memory cell.

For the foregoing reason, conventional sense amplifier arrangements become increasingly unreliable as the noise on a bit line increases.

OBJECTS OF THE INVENTION

It is a general object of the invention to provide an improved sense amplifier arrangement for an MOS memory.

It is a more specific object of the invention to provide a shared sense amplifier arrangement which provides good common mode noise rejection while simultaneously enabling the latched state of the sense amplifier to be ready by the input/output buss lines.

BRIEF DESCRIPTION OF THE DRAWING

The objects stated above and other objects of the invention are set forth with more particularly in the following detailed description and in the drawing, of which:

FIG. 1 illustrates a sense amplifier arrangement constructed in accordance with the teachings of the invention.

FIG. 3 illustrates various waveforms which aid in describing the operation of the preferred embodiment.

DETAILED DESCRIPTION OF THE PREFERRED EMBODIMENT

Figure 2:
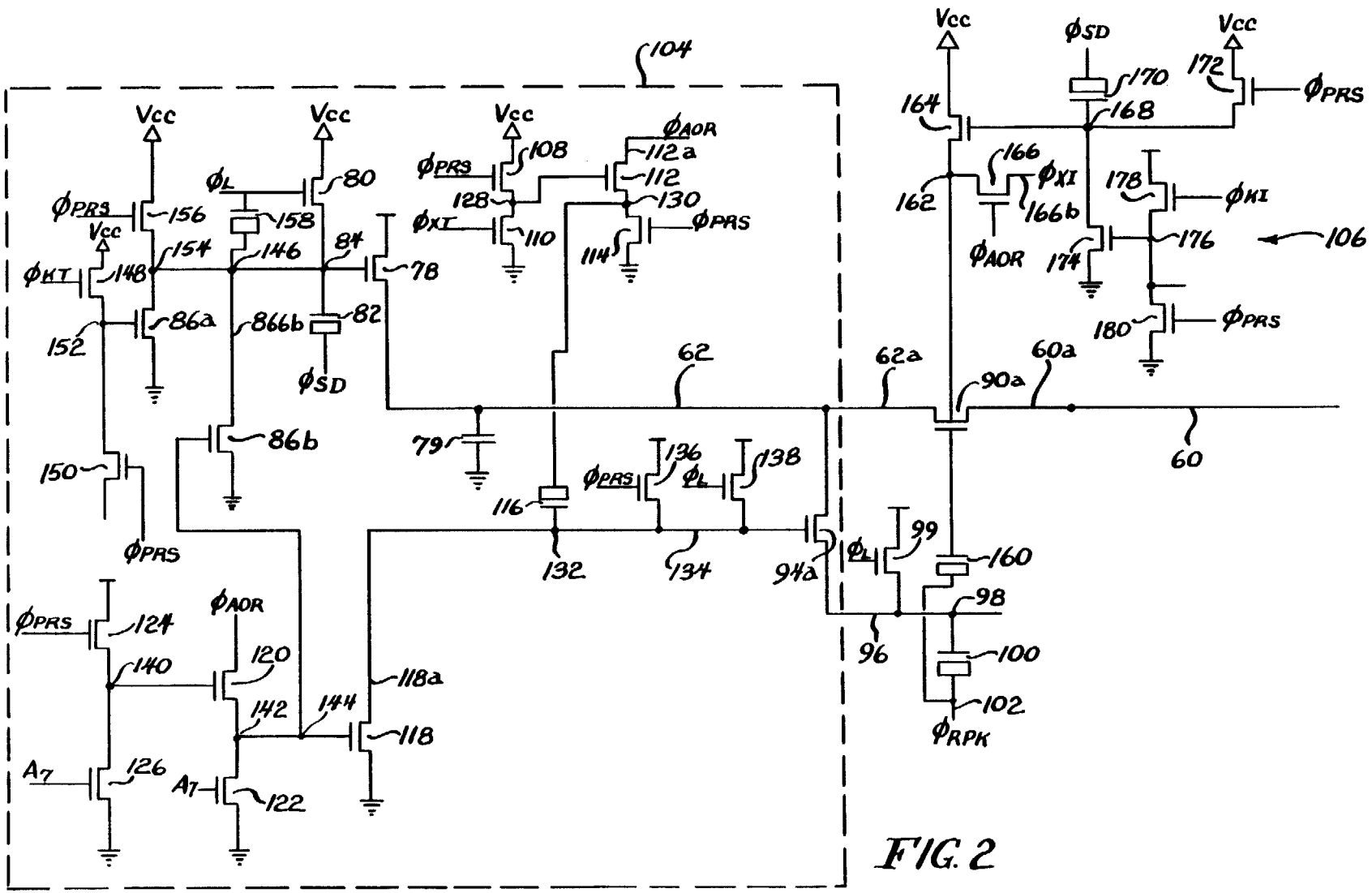
FIG. 2 is a more detailed circuit diagram of a portion of FIG. 1.

Referring to FIG. 1, a representative portion of a dynamic MOS memory is shown which includes a preferred embodiment of a sense amplifier arrangement. The illustrated portion has four pairs of bit lines identified as A-B, C-D, E-F, and G-H. The pair of bit lines A-B is coupled through isolation transistors 10 and 12 to a sense amplifier 14. The pair of bit lines C-D is similarly coupled to the sense amplifier 14 via isolation transistors 16 and 18. With this so-called "multiplexed folded bit line-shared sense amplifier" arrangement, the sense amplifier 14 is adapted by decoding circuitry to sense the potentials on bit lines A and B or on bit lines C and D. The pairs of bit lines E-F and G-H are similarly connected to another sense amplifier 20. As described in further detail below, one of the bit lines for each pair (A, for example) is coupled to a capacitor associated with an addressed memory cell so that a charge transfer occurs between that bit line and the latter capacitor. The other bit line in that pair (B, for example) carries a reference voltage induced by a dummy cell capacitor. The sense amplifier detects the voltage difference between bit lines A and B and latches in a state representing this difference. The latched state of the sense amplifier therefore represents the logic level of the addressed memory cell. Thereafter, the decoding circuitry enables the data on the bit lines A and B to be coupled to input/output (I/O and $\overline{I/O}$) buss lines 17 and 19 via bit lines C and D. The advantage of this arrangement is that the noise carried on bit line A is also carried on bit line B because the two bit lines are physically close to each other. Hence, there is good common mode noise rejection.

The above described arrangement is contrasted with the prior art wherein the sense amplifier detects the voltage difference between diagonally opposite bit lines A and D or B and C. For example, to sense the bit lines A and D, transistors 10 and 18 are turned on. If the voltage on bit line A exceeds the voltage on bit line D, the sense amplifier 14 latches in a state which pulls bit line D to a low level. Because bit line D is coupled to the $\overline{I/O}$ buss 19 via a transistor CD, the state of the sense amplifier is readily ascertained. Hence, bit line D provides a path for sensing the state of the amplifier 14. Bit lines B and C are used in the same manner.

Although the conventional sense amplifier arrangement provides a convenient path for coupling the sense amplifier to the I/O and $\overline{I/O}$ busses, it is undesirably sensitive close to each other, as are bit lines C and D. However, bit lines A and D (and B and C) are physically separated from each other on the memory chip.

Hence, any noise which affects bit line A will probably not influence bit line D in the same manner. The conventional sense amplifier arrangement senses bit lines having different amounts of noise and is therefore, susceptible to developing noise-induced errors. Because the present arrangement senses bit lines which are physically near each other on the chip, noise problems are reduced. In addition, switch circuitry described below permits the state of the sense amplifiers to be conveniently transferred to the I/O and I/O busses.

Referring more specifically to the sense amplifier 14, this device includes transistors 22 and 24 which are interconnected as a flip-flop with voltage nodes 21 and 23. As shown, terminal 10a of the transistor 10 is coupled to the drain of the transistor 22 and to the gate of the transistor 24. Terminal 12a of the transistor 12 is coupled to the drain of the transistor 24 and to the gate of the transistor 22. The sense amplifier is coupled to a latching transistor 25 whose gate is driven by clock signal $\phi_{SD}$.

The bit lines C and D are coupled via transistors 16 and 18, respectively, to the sense amplifier 14. As shown, terminal 16a of the transistor 16 is coupled to the drain of transistor 22 and to the gate of transistor 24. In addition, terminal 18a of the transistor 18 is coupled to the drain of the transistor 24 and to the gate of the transistor 22. From the above described arrangement, either the transistor pair 10 and 12 or the transistor pair 16 and 18 may be turned on to couple the sense amplifier 14 to bit lines A and B or to bit lines C and D.

An exemplary memory cell M1 is shown coupled to bit line A for accessing. Memory cell M1 includes a transistor 26 and a memory cell capacitor Cm. This capacitor conventionally stores a charge which is indicative of the logic state of the cell M1. A word line 28 is driven to a high level when the cell M1 is addressed so as to turn on the transistor 26 and thereby couple the capacitor Cm to the bit line A. Additional memory cells 30, each similar to the cell M1, are also associated with bit line A and may be coupled thereto when addressed by their own word lines. Similarly, memory cells groups 32, 34, and 36 are associated with bit lines B, C, and D, respectively, and may be selectively coupled to their associated bit lines when addressed by their own word lines.

Referring to bit lines E and F, they are associated with memory cell groups (not shown) and are coupled to the sense amplifier 20 via transistors 38 and 40, respectively. Bit lines G and H are also associated with memory cell groups (again, not shown) and are coupled to the sense amplifier 20 via transistors 42 and 44, respectively. Each memory cell group contains cells which are similar to the memory cell M1 and are addressed in a similar manner. The sense amplifier 20 operates in the same manner as the sense amplifier 14 to sense the voltage differential between bit lines E and F or between bit lines G and H, depending on whether transistors 38 and 40 are energized or whether transistors 42 and 44 are energized.

When the memory cell M1 is addressed, its memory capacitor $C_M$ is coupled to the bit line A via the transistor 26. Thus, a transfer of charge occurs between the latter capacitor and the bit line A, thereby altering the voltage level on that bit line. The voltage on bit line B is altered by a dummy cell D1 which is coupled to the bit line B and to another bit line (F, for example). Included in the dummy cell D1 is a dummy cell capacitor $C_D$, preferably of the same size as the memory cell capacitor $C_M$, and precharged to a reference voltage level (for example, 0 volts). In response to a signal on a dummy word line (not shown), the dummy capacitor is coupled to bit lines B and F such that substantially equal transfers of charge occur between the capacitor $C_D$ and the bit lines to which it is coupled. Thus, the charge on the dummy capacitor is split between both bit lines to alter the bit line voltages. Then the voltage on the bit line A is compared by the sense amplifier 14 with the voltage on the bit line B to determine the logic state of the memory cell M1.

A dummy cell D2, similar to the dummy cell D1, is coupled between the bit lines A and E. Likewise, similar dummy cells D3 and D4 are coupled between bit lines D-H and C-G, respectively. The dummy cells D2–D4 operate in a manner similar to the dummy cell D1 so as to alter the voltage on the bit lines to which they are coupled.

It should be pointed out that the construction of the memory cells and the dummy cells is not part of the present invention. Both types of cells may be conventional, although it is preferred that the dummy cells be constructed as described in U.S. application Ser. No. 194,614, filed Oct. 6, 1980, the teachings of which are incorporated herein.

Bit lines C, D, G, and H are coupled via transistors $C_T$, $D_T$, $G_T$, and $H_T$, respectively, to the I/O or the $\overline{I/O}$ buss lines. In the manner described below, the voltages on the selected pair of bit lines (for example, A and B) are sensed by the sense amplifiers and transferred to the buss lines via these transistors (for example, $C_T$ and $D_T$).

In order to select a pair of bit lines, a clock signal, indicated as $\phi_{RPL}$, is generated and coupled via line 60 to the gates of the transistors 10, 12, 38, and 40. In addition, another clock signal, indicated as $\phi_{RPR}$ is generated and coupled via line 62 to the gates of the transistors 16, 18, 42, and 44. If the pairs of bit lines A-B and E-F are to be sensed by sense amplifiers 14 and 20, respectively, the clock signal $\phi_{RPR}$ is pulled low and the clock signal $\phi_{RPL}$ is left floating above $V_{cc}$. Consequently, transistors 10 and 12 are turned on to couple the bit lines A and B to the sense amplifier 14, while transistors 38 and 40 are turned on for coupling the bit lines E and F to the sense amplifier 16. Concurrently, transistors 16, 18, 42, and 44 are held off to decouple the bit lines C, D, G, and H from the sense amplifiers 14 and 20. A more detailed description of the sensing operation is discussed below.

The clock signal $\phi_{RPL}$ on line 60 is generated by a circuit 64 which includes transistors 66–68 and capacitor 70 which are coupled together at node 72. The gate of transistor 68 is driven by clock signal $\phi_L$ while capacitor 70 couples clock signal $\phi_{SD}$ to node 72. A switch 74 is adapted to be closed for selectively coupling node 72 to ground.

In a similar fashion, the clock signal $\phi_{RPR}$ on line 62 is generated by a circuit 76 which includes transistors 78–80 and capacitor 82 which are all coupled to a node 84. The gate of transistor 80 is driven by the clock signal $\phi_L$ while capacitor 82 couples the clock signal $\phi_{SD}$ to node 84. Also, a switch 86 is included for selectively coupling node 84 to ground.

Circuits 64 and 76 are coupled via lines 60a and 62a, respectively, to a switch 90. In addition, lines 60b and 62b couple circuits 64 and 76 to switches 92 and 94. Line 96 connects switches 92 and 94 to a node 98 which is coupled via a capacitor 100 to a signal $\phi_{RPK}$ on line 102.

To sense the bit lines A and B, the following operation occurs. Referring to FIG. 3, various waveforms of different clock inputs into the illustrated embodiment are shown with respect to time for a better understanding of the operation. Assuming that lines 60 and 62 have been previously precharged to 9 volts and that $A_7$ (the most significant row address) registers a logic state of 0, the switches 74 and 94 are closed. Before the switches 74 and 94 close, the signal $\phi_{RPK}$ is high at 5 volts and line 96 is precharged to 5 volts. Therefore, there is no voltage across the capacitor 100. The signal $\phi_{RPK}$ goes to 0 volts at time $t_1$ (FIG. 3) when the switches 74 and 94 are closed. The 5 volt drop in the signal $\phi_{RPK}$ is coupled to lines 96 and 62 to pull the voltage on line 62 down toward 0 volts from its precharged level of 9 volts.

Referring to circuits 64 and 76, nodes 72 and 84 will have been precharged to 5 volts by a previous cycle of the signal $\phi_L$. The closing of switch 74 couples node 72 to ground and, accordingly, holds transistor 66 off. Hence, the high level voltage on line 60 is undisturbed. Since switch 86 remains open, the node 84 stays at the 5 volt level and transistor 78 turns on to clamp the voltage on line 62 to 5 volts minus 1 volt (the threshold voltage in this embodiment) or 4 volts. Consequently, transistors 16 and 18 are turned off while the 9 volt level on line 60 keeps the transistors 10 and 12 on, thereby coupling bit lines A and B to the sense amplifier 14.

The bit lines have also been precharged to 5 volts. However, when the memory cells are coupled to the bit lines A and B, the voltage on bit line A may drop down to 4.8 volts and the voltage on bit line B may drop down to 4.9 volts. Next, the sense amplifiers 14 and 20 are enabled by the signal $\phi_{SD}$ going high to 5 volts at time $t_2$. As a result, the latch transistor 25 turns on and enables the sense amplifier 14 to latch the voltage on node 21 to 0 volts and to leave the voltage on node 23 at about 4 volts. Because the 4 volts on line 62 is being applied to the gates of transistors 16 and 18, the 5 volts on node 23 does not disturb the 5 volt precharge level on bit line D. Accordingly, the 5 volt potential on line D continues to be coupled to $\overline{I/O}$ buss line 19. On the other hand, the 0 volt level on node 21 turns on transistor 16 which then couples that 0 volt level to I/O buss line 17 via bit line C.

The 5 volt kick of signal $\phi_{SD}$ is also coupled by capacitors 70 and 82 to nodes 72 and 84. Node 72 is not affected because it is still coupled to ground via closed switch 74. However, the voltage on node 84 is driven upwardly to approximately 7 volts. As a result, transistor 78 turns on harder to pull the voltage on line 62 up to 5 volts. This acts to improve the reading speed of the sense amplifiers by turning transistor 16 on harder, thereby enabling the 0 volts on node 21 to be more easily coupled to the I/O buss line 17. Furthermore, the signal $\phi_{RPR}$ on line 62 is continuously held at approximately 5 volts when transistor 78 is turned on hard. This is important in that if the signal $\phi_{RPR}$ is not actively held at the 5 volt level, then a low level signal on either bit line C or D would be capacitively coupled to line 62 via the gate-source capacitance of either transistor 16 or 18.

After the voltage difference between bit lines A and B is read on the I/O and $\overline{I/O}$ buss lines 17 and 19, the memory cell is refreshed in the following manner. The switch 86 in circuitry 76 closes to ground node 84 and turn the transistor 78 off. Consequently, the signal $\phi$RPR on line 62 is released from its clamped 5 volt level. Then the signal $\phi_{RPK}$ on line 102 goes high at time $t_3$. Simultaneously, the switch 90 is closed to short the signal $\phi_{RPL}$ on line 60 to the signal $\phi_{RPR}$ on line 62. When the sense amplifiers 14 and 20 had previously sensed the voltage differentials, the signal $\phi_{RPL}$ on line 60 was pulled from 9 volts down to about 7 volts as a result of being capacitively coupled by the transistors 10, 12, 38, and 40 to the lower voltages on bit lines A, B, E, and F. Therefore, when the signals $\phi_{RPL}$ (at 7 volts) and $\phi_{RPR}$ (at 5 volts) are shorted by switch 90 and the signal $\phi_{RPK}$ goes high, the signals $\phi_{RPL}$ and $\phi_{RPR}$ are first driven towards 6 volts and are then boosted back up to 7 volts to turn on all the isolation transistors. As a result, the sense amplifier couples bit line A to bit line C and bit line B to bit line D.

If a logic 1 were present in the memory cell capacitor Cm, the voltage on bit line A would have dropped to 4 volts as a result of the sense amplifier 14 sensing a logic 1 in the accessed cell M1 coupled to bit line A. However, the voltage on bit line C remains at 5 volts because transistor 18 stays off. Therefore, when bit lines A and C are coupled by the sense amplifier 14, the bit line capacitance of bit lines A and C is shared and the voltage on both bit lines goes to 4.5 volts. Correspondingly, the word line 28 is held at high voltage (by circuitry not shown) so that the 4.5 volts on bit line A refreshes the accessed memory cell capacitor Cm. After the voltage on the word line goes low, the switches 92 and 94 are opened and all the bit lines are precharged back to the 5 volt level by circuitry not shown in the figures. Also, the signals $\phi_{RPL}$ and $\phi_{RPR}$ are precharged back up to 9 volts by capacitive coupling through all the isolation transistors as the bit lines are precharged to 5 volts.

FIG. 2 illustrates a more detailed circuit 104 for regulating the signal $\phi_{RPR}$, on line 62. A duplicate circuit (not shown) controls the signal $\phi_{RPL}$ on line 60. Also, a more detailed circuit 106 of the elements common to the signals $\phi_{RPR}$ and $\phi_{RPL}$ is shown. The switch 94 in FIG. 1 is depicted in the form of transistor 94a in FIG. 2 and controlled by the circuitry arranged from transistors 108, 110, 112, 114, 116, 118, 120, 122, 124,126, 136, and 138. The switch 86 in FIG. 1 is arranged from transistors 86a and 86b and their associated circuitry in FIG. 2.

Referring more specifically to the circuitry which controls transistors 94a, transistors 108 and 110 are arranged as a push-pull driver for producing alternating high and low signals at node 128. Clock signals $\phi_{PRS}$ and $\phi_{XI}$ are applied as inputs into the respective gates of transistors 108 and 110. The signal on node 128 is applied to the gate of transistor 112 which is coupled to transistor 114 so as to form another push-pull driver for producing alternating high and low signals at node 130. The clock signals $\phi_{AOR}$ and $\phi_{PRS}$ are applied as inputs into terminal 112a of transistor 112 and the gate of transistor 114, respectively.

The signal on node 130 is coupled by capacitor 116 to node 132 which is, in turn, coupled via line 134 to the gate of transistor 94a. A pair of transistors 136 and 138 are also coupled to line 134 between node 132 and the gate of transistor 94a with clock signals $\phi_{PRS}$ and $\phi_L$ being applied as inputs to the gates of transistors 136 and 138. To complete the control circuitry for transistor 94a, a pair of push-pull drivers are arranged from transistors 120 and 122 and transistors 124 and 126 to drive transistor 118 which is coupled to node 132. Clock signal $\phi_{PRS}$ and the signal from row address $A_7$ are applied to the gates of push-pull transistors 124 and 126, respectively, to produce an output signal on node 140. This signal is then applied to the gate of transistor 120.

The signal from $A_7$ is applied to the gate of transistor 122 while the clock signal $\phi_{AOR}$ is applied to the source of transistor 120. The push-pull transistors 120 and 122 produce a signal on node 142. The signal on node 142 is then applied via node 144 to the gate of transistor 118, and the terminal 118a of the same transistor is coupled to node 132.

The transistor 94a is turned on by the above-mentioned control circuitry in the following manner. During precharging, the signal $\phi_{PRS}$ is a at a high level. Consequently, transistors 108 and 124 are turned on to pull the signals on nodes 128 and 140, respectively, up to 4 volts. Also, transistor 114 turns on to hold the signal on node 130 at ground. When $A_7$ reaches the logic 1 state at time $t_4$ (See FIG. 3) transistor 126 turns on. As a result, the signal on node 140 is pulled to ground. Concurrently, $A_7$ turns on transistor 122 which, in turn, holds the signal on node 142 to ground. When the signal $\phi_{AOR}$ goes high at time $t_5$, the signal on node 142 remains low because the transistor 120 is still off due to the signal on node 140 also being low. However, the signal on node 130 goes high because transistor 112 is turned on. The positive transition on node 130 is coupled through capacitor 116 to node 132, thereby pulling up the signal on node 132. The high signal on node 132 is coupled via line 134 to the gate of transistor 94a, thereby turning on transistor 94a.

More detailed circuitry for the switch 74 of FIG. 1 is not shown in FIG. 2. However, the circuitry for switch 74 is the duplicate circuitry of that disclosed for switch 86. In FIG. 2, switch 86 is depicted by transistors 86a and 86b and associated circuitry. The gate of transistor 86b is coupled to node 144 while the terminal 86bb of transistor 86b is coupled to node 146. The transistor 86a is arranged such that its gate is coupled to a pair of push-pull transistors 148 and 150. The gate of transistor 148 is driven by a clock signal $\phi_{KI}$, while the gate of transistor 150 is driven by the clock signal $\phi_{PRS}$. The transistor 148 is coupled to the transistor 150 at node 152 which, in turn, is connected to the gate of transistor 86a. The transistor 86a is coupled via node 154 to the transistor 156. Node 154 is also coupled to node 146. The gate of transistor 156 is driven by the clock signal $\phi_{PRS}$.

Just as in FIG. 1, transistor 80 is coupled to transistor 82 at node 84, and the gate of transistor 80 is driven by the clock signal $\phi_L$. Also, 84 is coupled to transistor 78 which is connected to line 62. However, capacitor 158 has been added to couple the signal $\phi_L$ on the gate of transistor 80 to the node 146. In addition, a capacitor 79 is coupled to transistor 78 on line 62.

As mentioned above, transistors representing the switch 74 are not shown in FIG. 2 although transistors 86a and 86b and their peripheral circuitry duplicate that of switch 74. Therefore, for purposes of explanation, assume that the transistors for switch 74 are transistors 86a and 86b. Also, assume that the inputs to the gates of transistors 122 and 126 are $\overline{A}_7$ rather than $A_7$ such that $\overline{A}_7$ is at a logic 0 state. When the signal $\phi_{AOR}$ rises at time $t_5$, the signal on node 142 and node 144 is pulled high by transistor 120 to turn transistor 86b on. As a result, the signal on node 84 is pulled to ground. Then the clock signal $\phi_{SD}$ rises at time $t_2$. This rise is coupled via capacitor 82 to node 84. However, node 84 remains low because transistor 86b is on. For signal $\phi_{RPR}$ on line 62, transistor 86b is turned off. Hence, node 84 is capacitively coupled to about 7 volts as the clock signal $\phi_{SD}$ rises at time $t_2$. As a result, the signal $\phi_{RPR}$ is clamped to 5 volts during sense amplifier latching.

The switch 86 is closed when the signal $\phi_{KI}$ rises at time $t_6$ (See FIG. 3) to turn on transistor 148, thereby pulling the signal on node 152 high to turn on transistor 86a. As a result, the signal on node 84 is pulled to ground. It should be noted that the signal on node 152 had previously been precharged low by the clock signal $\phi_{PRS}$ via transistor 150.

Switch 90 in FIG. 1 is depicted by transistor 90a and its associated circuitry in FIG. 2. The drain and source of transistor 90a are connected to lines 60a and 62a, respectively. The gate of transistor 90a and node 162 are capacitively coupled by transistor 160 to the clock signal $\phi_{RPK}$ on line 102. This signal is also coupled by capacitor 100 to node 98 which, in turn, is connected on line 96 to the transistor 94a and to transistor 99 being driven by the clock signal $\phi_L$.

Node 162 is coupled to push-pull transistors 164 and 166. The terminal 166b of transistor 166 is coupled to clock signal $\phi_{XI}$ while the gate of the same transistor is driven by signal $\phi_{AOR}$. The gate of transistor 162 is driven by the signal on node 168 which is coupled to transistors 170, 172, and 174. Transistor 170 capacitively couples node 168 to signal $\phi_{SD}$. The gate of transistor 172 is driven by the signal $\phi_{PRS}$, while the gate of transistor 174 is driven by the signal on node 176. This signal, in turn, is developed by push-pull transistors 178 and 180 which is also coupled to node 176. The gate of transistor 178 is driven by signal $\phi_{KI}$, while the gate of transistor 180 is driven by signal $\phi_{PRS}$.

To turn on transistor 90a, the signal on node 168 is precharged to 4 volts by the signal $\phi_{PRS}$ turning on transistor 172. Thereafter, the signal $\phi_{SD}$ goes high at time $t_2$, and this high is capacitively coupled by transistor 170 to node 168. As a result, the signal on node 168 is kicked up to 7 volts. Accordingly, transistor 164 is pulled on to pull the signal on node 162 to the 5 volt level. When the signal $\phi_{RPK}$ goes high at time $t_3$, the high is capacitively coupled by capacitor 160 to kick up the signal on the gate of transistor 90a. Hence, transistor 90a turns on to short lines 60 and 62 together. Thereafter, the signals on these lines move towards 6 volts. The signal on node 168 is driven to ground to keep transistor 164 turned off while the signal on the gate of transistor 90a is kicked up to avoid losing charge to $V_{cc}$ via transistor 164. In order to do this, the signal $\phi_{KI}$ turns on transistor 178 to raise the signal on node 176, and, consequently, the transistor 174 turns on to pull down the signal on node 168.

The low to high transition of the signal $\phi_{RPK}$ is also capacitively coupled via transistor 100 and node 98 to transistor 94a for driving the signal on shorted lines 60 and 62 up to 7 volts. This permits refreshing of the memory cell capacitor Cm as described above. Then the bit lines get precharged to 5 volts which further drives the signal on lines 60 and 62 to 9 volts. Thereafter, the sensing operation as described above is ready to be performed.

Although the invention has been described in terms of a preferred embodiment, it will be obvious to those skilled in the art that many alterations and modifications may be made without departing from the invention. Accordingly, it is intended that all such alterations and modifications be included within the spirit and scope of the invention as defined by the appended claims.

What is claimed is:

1. In an MOS memory having a plurality of memory cells each having a memory cell capacitor adapted to be charged so as to reflect the logic state of its memory cell, having a plurality of bit lines with associated isolation transistors and word lines for accessing a particular memory cell, and having a plurality of input/output buss lines for reading the logic state of the accessed memory cell, a folded bit line-shared sense amplifier arrangement for sensing the state of an accessed memory cell, comprising:

a shared sense amplifier positioned between and coupled to first and second bit lines (*A, C*) via first and second isolation transistors and positioned between and coupled to third and fourth bit lines (*B, D*) via third and fourth isolation transistors, said first and said third bit lines being adjacent each other and said second and said fourth bit lines being adjacent each other;

*said third bit line (B) having a dummy cell (D1) associated therewith for use when reading a memory cell (M1) associated with said first bit line (A);*

*said shared sense amplifier providing signals to only one pair of input/output buss lines, said buss line being located on only one side of said sense amplifier and being coupled to said second and fourth bit lines;* decoding means for selectively activating said first and third isolation transistors to couple said first and third bit lines, *and thereby said accessed memory cell and said dummy cell,* to said shared sense amplifier; and means for enabling said shared sense amplifier to latch in a state indicative of the difference in voltage between said first bit line and said third bit line, said difference representing the logic state of the accessed memory cell, said decoding means selectively conditioning said second and fourth isolation transistors to couple said latched state of said shared sense amplifier to [the] *said one pair of* input/output buss lines via said second and fourth bit lines *regardless of whether the accessed memory cell is positioned between the input/output buss line and the shared sense amplifier or the shared sense amplifier is positioned between the accessed memory cell and the input/output buss,* so as to read the voltage state of the accessed memory cell[;].

2. The folded bit line-shared sense amplifier arrangement of claim 1 wherein said decoding means drives the voltage on said bit lines up to a predetermined level after the voltage state of the accessed memory has been read by the input/output buss lines so as to refresh the memory cell capacitor of the accessed memory cell for further sensing by said sense amplifier.

3. The folded bit line-shared sense amplifier arrangement of claim 1 wherein said decoding means includes a first conductive line coupled to said first and third isolation transistors, a second conductive line coupled to said second and fourth isolation transistors, means for generating a first clock signal for application to said first conductive line, means for generating a second clock signal for application to said second conductive line, switching means coupled to said first and second conductive lines for selectively driving said first clock signal high to turn on said first and third isolation transistors and for driving said second clock signal to a relatively low level to inhibit the sense amplifier from sensing the voltages on said second and fourth bit lines, thereby permitting said shared sense amplifier to sense the state representative of the addressed memory cell.

4. The folded bit line-shared sense amplifier arrangement of claim 3 wherein said switching means includes a first switch coupled at a first node to said first clock generating means and to said first conductive line, a second switch coupled at a second node to said second clock generating means and to said second conductive line, a third switch for coupling said first clock generating means to ground, a fourth switch for coupling said second clock generating means to ground, and a fifth switch for selectively shorting said first node to said second node, said first switch and said second switch being coupled together at a third node which is capacitively coupled to a third clock signal for charging said third node.

5. The folded bit line-shared sense amplifier arrangement of claim 3 wherein said latching means is driven by a latch clock signal and wherein said first and second clock generating means each include a first clock generating transistor, a second clock generating transistor, and a clock generating node for coupling the drain of said second clock generating transistor to the gate of said first clock generating transistor, the gate of said second clock generating transistor driven by a fourth clock signal, said clock generating node capacitively coupled to said latch clock signal, said first and second generating means each coupled via said clock generating nodes to said third and fourth switches, respectively, and said first and second generating means coupled via said first clock generating transistors to said first and second conductive lines, respectively.

6. The folded bit line-shared sense amplifier arrangement of claim 4 wherein said first switch includes a first switch transistor and a first driver means for selectively turning on said first switch transistor and said second switch includes a second switch transistor and a second driver means for selectively turning on said second switch transistor, said first and second driver means receiving complementary row address logic states so that said first and second switch transistors are alternatively turned on.

7. The folded bit line-shared sense amplifier arrangement of claim 4 wherein said fifth switch includes a third switch transistor capacitively coupled to said third clock signal for turning on and a third driver means for selectively driving the charge on the gate of said third switch transistor higher.

8. The folded bit line-shared sense amplifier arrangement of claim 6 wherein said first and second drivers each include a first push-pull driver receiving fifth and sixth cloth signals for generating a signal at a fourth node; a second push-pull driver receiving a seventh clock signal, said fifth clock signal and the signal on said fourth node for generating a signal at a fifth node, the signal on said fifth node being capacitively coupled to a sixth node, a third push-pull driver receiving said fifth clock signal and a row address signal for generating a signal on a seventh node, a fourth push-pull driver receiving the signal from said seventh node and said row address signal for generating a signal on an eighth node, the signal on said eighth node being coupled to said sixth node via a first transistor means, the signal on said sixth node being coupled to a first lead, said first lead being coupled to a second transistor means and a third transistor means, said second transistor means being driven by said fifth clock signal, said third transistor means being driven by said fourth clock signal, and said first and second drivers being coupled via said first lead to said first and second switch transistors, respectively.

9. The folded bit line-shared sense amplifier arrangement of claim 8 wherein said third and fourth switches each include a pair of switch transistors, one transistor of said pair having its gate coupled to said eighth node, its first terminal connected to ground, and its second terminal coupled to a ninth node, the other transistor of said pair having its gate coupled to a fifth push-pull driver, its first terminal connected to ground, and its second terminal coupled to a tenth node, said fifth driver receiving an eighth clock signal and said fifth clock signal for generating a signal to be applied to the gate of said other transistor, said tenth node being coupled to said ninth node and to a fourth transistor means, said fourth transistor means being driven by said fifth clock signal, said fourth clock signal being capacitively coupled to said ninth node, and said third and fourth switches being coupled to said first and second clock generating means, respectively, via said ninth node.

10. The folded bit line-shared sense amplifier arrangement of claim 7 wherein said third driver means includes a sixth push-pull driver, a seventh push-pull driver, and an eighth push-pull driver; said sixth push-pull driver receiving said fifth and eighth clock signals for generating a first driver signal; said seventh push-pull driver receiving said fifth clock signal and said first driver signal and being capacitively coupled to said latch clock signal for generating a second driver signal; said eighth push-pull driver receiving said sixth clock signal, said seventh clock signal and said second driver signal for generating a third driver signal which is applied to the gate of said third transistor switch, the gate of said third transistor switch also being capacitively coupled to said third clock signal.

*11. The folded bit line-shared sense amplifier arrangement of claim 1 wherein said isolation transistors are controlled to transfer data through the shared sense amplifier when the shared sense amplifier is positioned between the accessed memory cell and the input/output lines to be coupled to the memory cell by using the state of the sense amplifier to turn on said second and fourth isolation transistors automatically when data has been sensed by the sense amplifier.*

*12. The folded bit line-shared sense amplifier arrangement of claim 1 wherein when said accessed memory cell is associated with said first or third bit lines, said second and fourth isolation transistors are conditioned to isolate said second and fourth bit lines from said sense amplifier, and so that said second and fourth isolation transistors are responsive to voltages developed in said sense amplifier when data has been latched thereinto to turn on at least one of said second and fourth isolation transistors thereby to couple said data via said second and fourth bit lines to said one pair of input/output buss lines.*

* * * * *